(12) United States Patent
Sharma et al.

(10) Patent No.: US 6,483,734 B1
(45) Date of Patent: Nov. 19, 2002

(54) MEMORY DEVICE HAVING MEMORY CELLS CAPABLE OF FOUR STATES

(75) Inventors: Manish Sharma, Sunnyvale, CA (US); Lung T. Tran, Saratoga, CA (US)

(73) Assignee: Hewlett Packard Company, Palo Alto, CA (US)

(*) Notice: Subject to any disclaimer, the term of this patent is extended or adjusted under 35 U.S.C. 154(b) by 0 days.

(21) Appl. No.: 09/992,426

(22) Filed: Nov. 26, 2001

(51) Int. Cl.⁷ ............................................... G11C 17/02
(52) U.S. Cl. ........................... 365/97; 365/96; 365/100; 365/46
(58) Field of Search ............................. 365/97, 96, 100, 365/46

(56) References Cited

U.S. PATENT DOCUMENTS

| | | | |
|---|---|---|---|
| 5,550,772 A | 8/1996 | Gill | 365/185.03 |
| 5,640,343 A | 6/1997 | Gallagher et al. | |
| 5,701,222 A | 12/1997 | Gill et al. | |
| 5,734,605 A | 3/1998 | Zhu et al. | 365/173 |
| 5,862,074 A | 1/1999 | Park | 365/185.03 |
| 5,930,164 A | 7/1999 | Zhu | 365/158 |
| 5,978,257 A | 11/1999 | Zhu et al. | 365/173 |
| 5,991,193 A | 11/1999 | Gallagher et al. | |
| 5,999,438 A | 12/1999 | Ohsawa | 365/145 |
| 6,104,632 A | 8/2000 | Nishimura | |
| 6,169,686 B1 | 1/2001 | Brug et al. | 365/171 |
| 6,178,114 B1 | 1/2001 | Yang | 365/185.03 |
| 6,185,122 B1 | 6/2001 | Johnson et al. | 365/103 |
| 6,252,796 B1 | 6/2001 | Lenssen et al. | 365/173 |
| 6,259,644 B1 | 7/2001 | Tran et al. | 365/209 |
| 6,269,018 B1 | 7/2001 | Monsma et al. | |
| 6,324,093 B1 * | 11/2001 | Perner et al. | 365/171 |
| 6,333,944 B1 | 12/2001 | Monsma et al. | |
| 6,351,406 B1 * | 2/2002 | Johnson et al. | 365/103 |

OTHER PUBLICATIONS

Wang, Z.G., et al., "Faster and Denser Spin–Tunneling Random Access Memory (STram)", Sep. 5, 1997, IEEE Transactions on Magnetics, vol. 33, No. 5, pp. 3304–3306.

* cited by examiner

Primary Examiner—Huan Hoang

(57) ABSTRACT

A memory device includes memory cells having a re-writeable element and a write-once element in series with the re-writeable element. The re-writeable element is programmable between a high resistance state and a low resistance state. The write-once element can be an anti-fuse element that is programmable from a high resistance state to a low resistance state, or a fuse element that is programmable from a low resistance state to a high resistance state. The two possible states for the re-writeable element and the two possible states for the write-once element allow the memory cells to store four different bits.

18 Claims, 11 Drawing Sheets

MEMORY DEVICE HAVING MEMORY CELLS CAPABLE OF FOUR STATES

RELATED APPLICATIONS

The following applications of the common assignee may contain some common disclosure and may relate to the present application:

U.S. patent application No. 09/951,378, entitled "MEMORY DEVICE HAVING DUAL TUNNEL JUNCTION MEMORY CELLS" and U.S. patent application No. 09/983,404, entitled "MEMORY DEVICE HAVING MEMORY CELLS WITH MAGNETIC TUNNEL JUNCTION AND TUNNEL JUNCTION IN SERIES".

TECHNICAL FIELD

The technical field is memory devices for storing data. More particularly, the technical field is memory devices having memory cells capable of storing four different bits.

BACKGROUND

Memory devices are utilized in consumer electronic products to store data such as instructions utilized by the products. Nonvolatile memory devices are desirable because they do not require power to store data. Therefore, data stored in nonvolatile memory devices is preserved when a power supply is exhausted or disconnected from the memory device. Consumers also prefer products of small volume and low cost, and the requirements of nonvolatility, high density, and low cost are primary driving factors in the design of memory devices. Low power consumption is also desirable because smaller power sources can be used, reducing the size of consumer electronic products.

Nonvolatile memory devices typically have one time programmable (OTP) or reprogrammable memory cells. A reprogrammable, or "re-writeable" memory cell can be switched among binary states. An OTP, or "write-once" memory cell's state is permanent once the cell is programmed. OTP memory devices can generally be classified as one of fuse, anti-fuse, charge storage, or mask read only memory (mask ROM).

A fuse memory cell is programmed by applying a voltage across the cell so that the cell is "blown" during programming. The binary state of fuse memory cells can be detected as the resistance of the cell measured during a read process. Conventional fuse memory devices have a low array density because the contact regions required for each fuse element occupy a large area of the substrate. Conventional fuse memory cells also often include an isolation element such as a diode or transistor, which further increases cell size. Isolation diodes and transistors have limited current capability, and may be damaged by the write currents required to program the fuse memory cells. In addition, the isolation diodes and transistors are typically active silicon-based elements, which are most readily formed on a silicon crystal substrate. Isolation elements of this type may preclude stacking of multiple layers of fuse OTP arrays, decreasing possible device capacity. Silicon-based isolation elements such as micro-crystalline and amorphous diodes and transistors may enable stacking, but increase complexity and cost of fabrication.

Conventional anti-fuse memory cells typically include a metal-dielectric-metal stack. Conventional anti-fuse memory cells are programmed by applying a write potential across the cells. The write potential triggers the anti-fuse and reduces the resistance of a programmed memory cell. Conventional anti-fuse memory cells suffer many of the same disadvantages as fuse/transistor cells. For example, conventional anti-fuse memory cells may require silicon-based isolation elements, which decrease array density.

A common conventional charge storage memory is EPROM. EPROM memory utilizes Fowler-Nordheim tunneling to transfer charge from a substrate to a floating gate in the memory cell. EPROM memories require a large write voltage, and the write speed in EPROM devices is limited by tunneling current density.

Mask ROM memories are programmed at the time of fabrication, rather than at the user level ("field programming"). Therefore, each batch of mask ROM devices is application-specific. As in most manufacturing processes, cost savings are realized with increased volume. Therefore, in order for mask ROM production to be cost-effective, there must be a large demand for an application-specific memory. The requirement for large-scale processing renders mask ROM too costly for many applications.

FIG. 1 illustrates a conventional MRAM memory array 10 having resistive memory cells 12 located at cross points of word lines 14 and bit lines 16. The word lines 14 extend horizontally along rows of the memory array 10, and the bit lines 16 extend vertically along columns of the memory array 10. Each memory cell 12 is capable of storing the binary states of "1" and "0" FIG. 2 illustrates a conventional MRAM memory cell 12. The memory cell 12 includes a pinned layer 24 and a free layer 18. The pinned layer 24 has a magnetization that has a fixed orientation, illustrated by the arrow 26. The magnetization of the free layer 18, illustrated by the bi-directional arrow 28, can be oriented in either of two directions along an "easy axis" of the free layer 18. If the magnetizations of the free layer 18 and the pinned layer 24 are in the same direction, the orientation of the memory cell 12 is "parallel." If the magnetizations are in opposite directions, the orientation is "anti-parallel." The two orientations correspond to the binary states of "1" and "0," respectively.

The free layer 18 and the pinned layer 24 are separated by an insulating tunnel barrier layer 20. The insulating tunnel barrier layer 20 allows quantum mechanical tunneling to occur between the free layer 18 and the pinned layer 24. The tunneling is electron spin dependent, making the resistance of the memory cell 12 a function of the relative orientations of the magnetizations of the free layer 18 and the pinned layer 24. The resistance of the memory cell 12 may have a "low" value of $R-\Delta/2$ if the orientation is parallel, and a "high" value of $R+\Delta/2$ if the orientation is anti-parallel.

Each memory cell 12 in the memory array 10 can have its binary state changed by a write operation. Write currents Ix and Iy supplied to the word line 14 and the bit line 16 crossing at a selected memory cell 12 switch the magnetization of the free layer 18 between parallel and anti-parallel with the pinned layer 24. The current Iy passing through the bit line 16 results in the magnetic field Hx, and the current Ix passing through the word line 14 results in the magnetic field Hy. The fields Hx and Hy combine to switch the magnetic orientation of the memory cell 12 from parallel to anti-parallel. A current −Iy can be applied with the current Ix to switch the memory cell 12 back to parallel. In order to switch the state of the memory cell 12 from parallel to anti-parallel, and vice versa, the combined field created by Hx and +/−Hy exceed a critical switching field Hc of the memory cell 12. The change in resistance due to the changing memory cell magnetization is readable to determine the binary state of the memory cell 12.

While MRAM memory provides for stable storage of data and reprogrammability, only two states can be stored in conventional MRAMs. The limitation of data storage to two bit states per MRAM memory cell limits the data storage density of conventional MRAM memory arrays.

A need therefore exists for a memory device having memory cells capable of high data storage density arrangement and relatively low cost.

SUMMARY

According to a first aspect, a memory array includes a plurality of memory cells located at the intersections of word and bit lines. The memory cells each have two storage elements in series. One storage element is a re-writeable element, and the other is a write-once element. The re-writeable element is programmable between a high resistance state and a low resistance state. The write-once element can be an anti-fuse element that is also programmable from a high resistance state to a low resistance state, or a fuse element that is programmable from a low resistance state to a high resistance state.

According to the first aspect, the two possible states for the re-writeable element and the two possible states for the write-once element allow the memory cells to occupy four different states, and therefore store four bits of data.

Also according to the first aspect, the memory cells are smaller than conventional memory cells having diode/transistor isolation elements. This aspect further increases array density.

Also according to the first aspect, the memory device can operate at a low programming voltage by using a relatively thin tunnel barrier in the anti-fuse element.

Also according to the first aspect, the memory device can advantageously employ an equipotential read method because of the presence of the re-writeable element.

Also according to the first aspect, active silicon-based isolation diodes and/or transistors are not required to isolate the memory cells. The memory device can therefore include stacked memory elements, increasing array density.

Other aspects and advantages will become apparent from the following detailed description, taken in conjunction with the accompanying drawings.

DESCRIPTION OF THE DRAWINGS

The detailed description will refer to the following drawings, in which like numerals refer to like elements, and in which.

DETAILED DESCRIPTION

A memory device having memory cells capable of storing four bits will be discussed by way of preferred embodiments and by way of the drawings.

Figure 1:
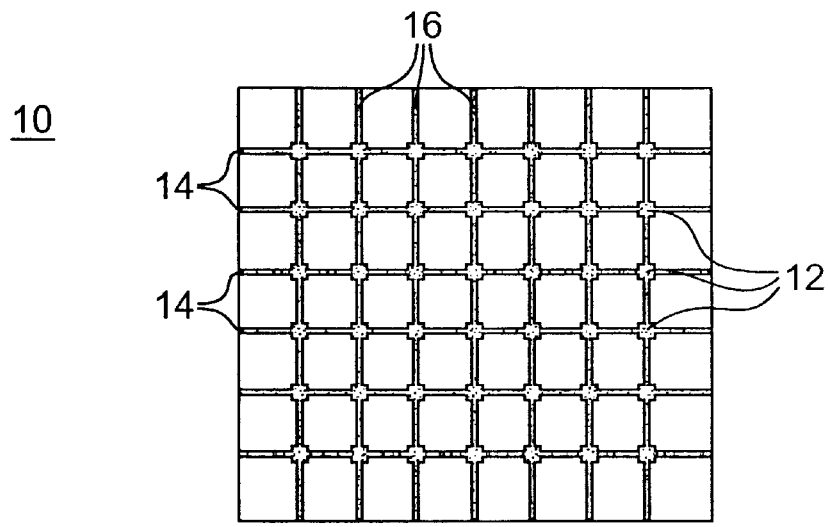
FIG. 1 illustrates a conventional MRAM memory array.
Figure 2:
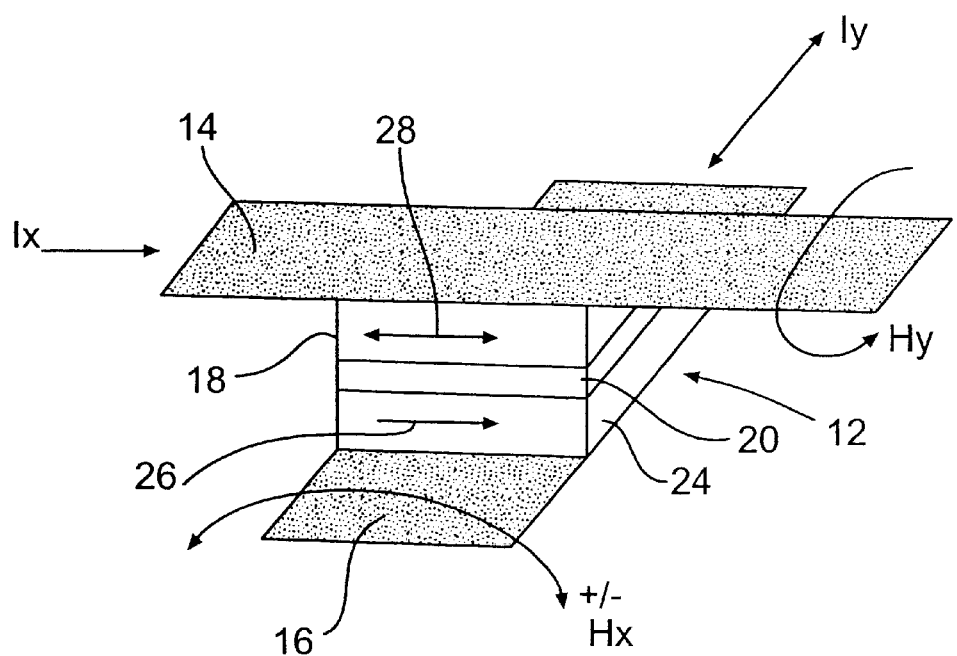
FIG. 2 illustrates binary states of a conventional MRAM memory cell.
Figure 3:
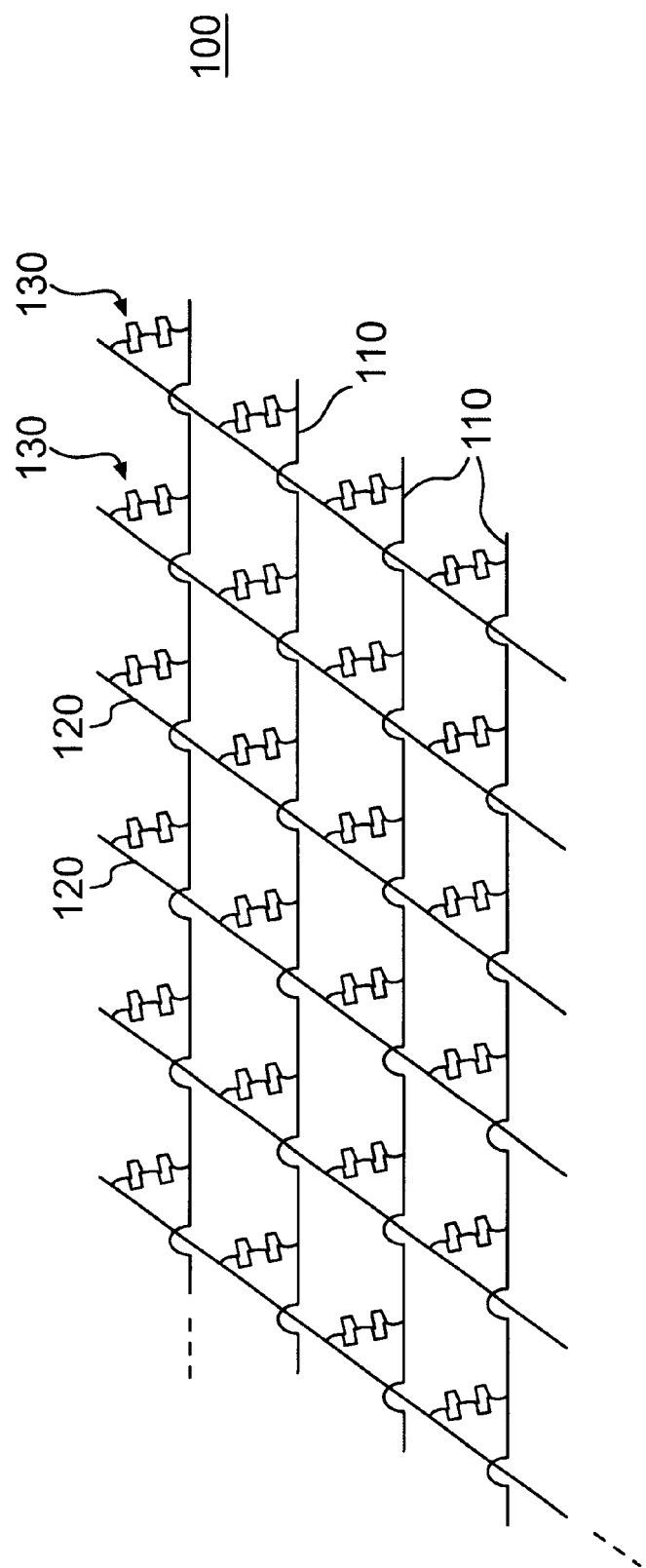
FIG. 3 is a schematic perspective view of a memory array according to a first embodiment.

FIG. 3 is a schematic perspective view of a memory array 100. The memory array 100 includes memory cells 130 each having a write-once element and a re-writeable element. In the memory array 100, word lines 110 extend in horizontal rows, and bit lines 120 extend in vertical columns. The word lines 110 cross the bit lines 120 at memory cells 130. Each memory cell 130 can store one of four memory states, or bits. In FIG. 3, four rows of word lines 110 and six columns of bit lines 120, intersecting at twenty-four memory cells 130, are shown for the purposes of illustration. In practice, arrays of 1024×1024 memory cells and larger, for example, may be used. In FIG. 1, the memory cells 130 are illustrated symbolically as two resistive elements. Each resistive element corresponds to a storage element in a memory cell 130.

Figure 4:
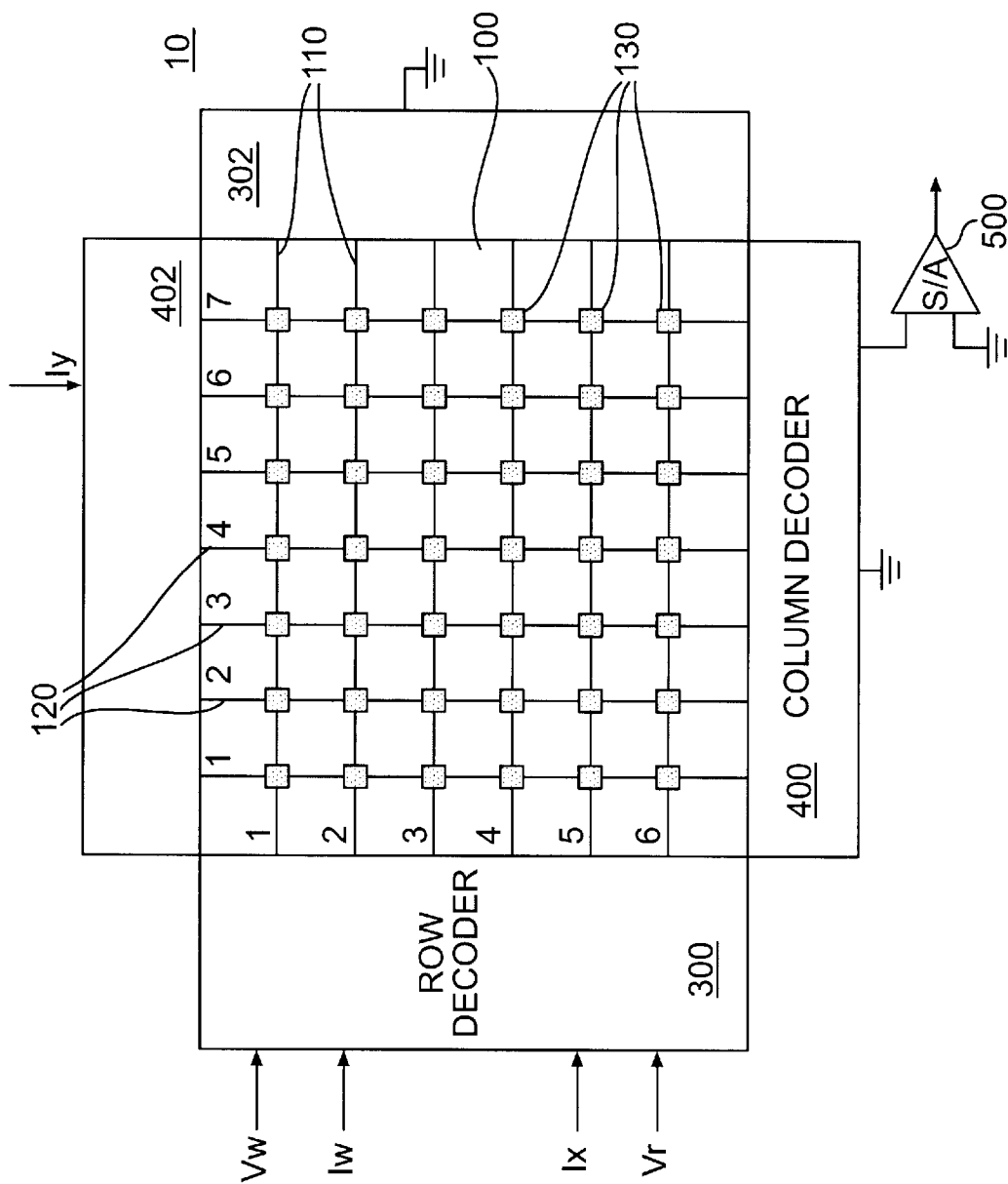
FIG. 4 is a schematic view of a memory device including a memory array as illustrated in FIG. 3, and associated read/write circuitry.

FIG. 4 is a schematic view of a memory device 10 including a memory array 100 as illustrated in FIG. 1, and associated read/write circuitry. The memory device 10 comprises the memory array 100, a row decoder 300 coupled to rows 1–6 of the memory array 100, a switch bank 302 coupled to rows 1–6, a column decoder 400 coupled to columns 1–7 of the memory array 100, a switch bank 402 coupled to columns 1–7, and a sense amplifier 500 for detecting a binary state of the memory cells 130 during read operations.

The row decoder 300 can include a plurality of switches for selectively applying any one of a write potential Vw, a write current Iw, a write current Ix, or a read potential Vr, to rows containing a selected memory cell 130. Similarly, the column decoder 400 can include a plurality of switches for coupling selected columns containing selected memory cells 130 to ground during a write operation. The switch bank 402 can include a plurality of switches for selectively applying a write current Iy to columns containing selected memory cells 130. The switch bank 302 can include a plurality of switches for selectively coupling columns containing selected memory cells 130 to ground.

FIGS. 5A–5D illustrate the four states for a memory cell 130. In FIGS. 5A–5D, the elements of the memory cell 130 are illustrated schematically as including a re-writeable element 134 and a write-once element 136 in series with the re-writeable element 134. In FIGS. 5A–5D, the re-writeable element 134 is illustrated as a magnetic random access memory (MRAM). Other re-writeable elements, such as, for example, flash memory elements, ferroelectric (FERAM) memory elements, and other re-writeable elements, may also be used. The write-once element 136 is illustrated as a magnetic tunnel junction (MTJ). Other anti-fuse write-once elements, such as, for example, a thin layer of diamond-like carbon (DLC), a layer of Ti/Ta/X, where X is a metal, a layer of Ti/TaN/TiW, and other elements, may also be used.

The memory cell 130 is located at the intersection, or cross point, of a word line 110 and a bit line 120. The re-writeable element 134 and the write-once element 136 allow the memory cell 130 to store one of four different states, or bits. The bits can be arbitrarily assigned the values of 1, 2, 3 and 4, or any other values. Each state corresponds to a different resistance of the memory cell 130. The four bit states are discussed below.

Figure 5A:
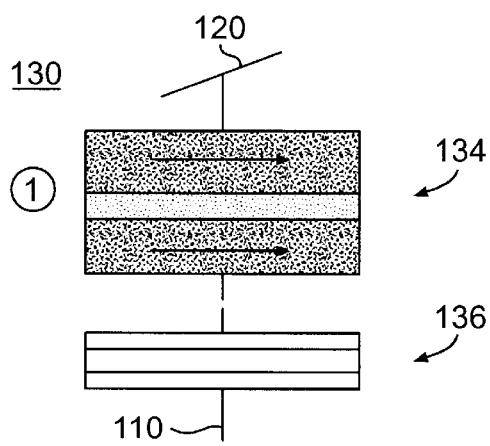
FIG. 5A is a schematic view of a first embodiment of a memory cell in a first state.
Figure 6:
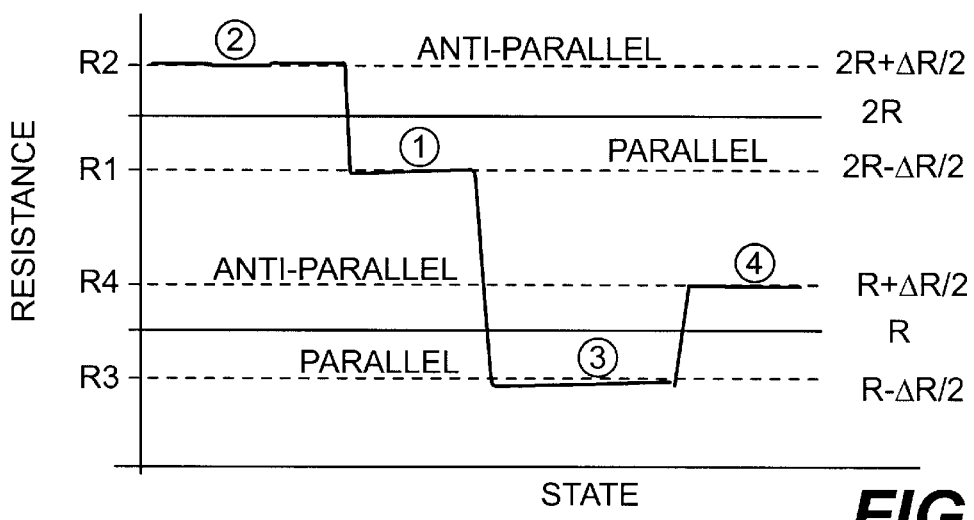
FIG. 6 illustrates resistance values of the memory cell illustrated in FIGS. 5A–5D.

The first state for the memory cell 130 is illustrated in FIG. 5A, which can be assigned the state value of "1." In FIG. 6, state 1 is also illustrated as a resistance value for the memory cell 130. In state 1, the MRAM re-writeable element 134 is in a low resistance, parallel state, and the MTJ write-once element 136 is in a high resistance state. Assuming minimal resistance from any conductors in the memory cell 130, the resistance of the memory cell 130 is substantially equal to the sum of the resistances across the re-writeable element 134 and the write-once element 136. In state 1, the resultant resistance of the memory cell 130 is R1.

Figure 5B:
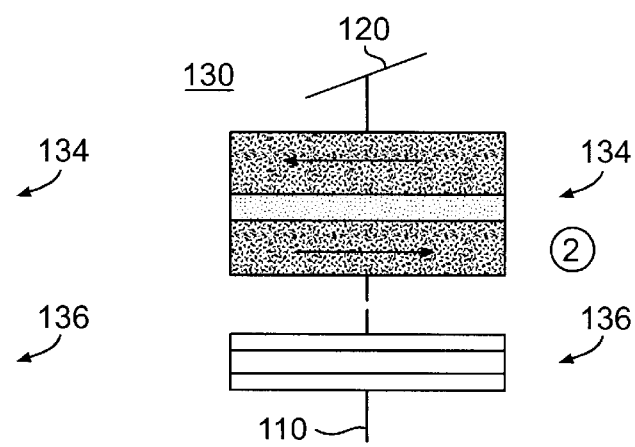
FIG. 5B is a schematic view of the first embodiment of the memory cell in a second state.

The second state for the memory cell 130 is illustrated in FIG. 5B, which can be assigned a state value of "2." In state 2, the MRAM re-writeable element 134 is in a high resistance, anti-parallel state. The MTJ write-once element 136 is in a high resistance state. The resultant resistance of the memory cell 130 is R2.

Figure 5C:
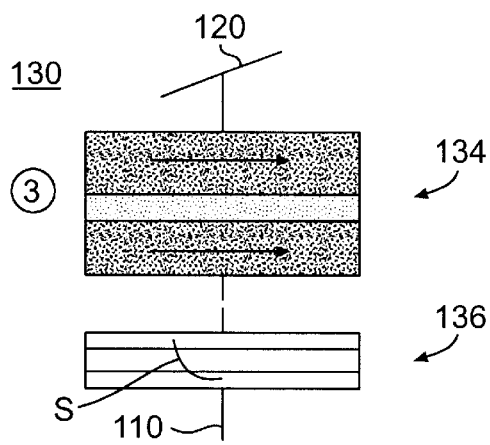
FIG. 5C is a schematic view of the first embodiment of the memory cell in a third state.

The third state for the memory cell 130 is illustrated in FIG. 5C, which can be assigned a state value of "3." In state 3, the MRAM re-writeable element 134 is in a low resistance, parallel state. The MTJ write-once element 136 is in a low resistance state. The resultant resistance of the memory cell 130 is R3. In the embodiment illustrated in FIG. 5C, the low resistance state is a short state. The short is illustrated symbolically as a short S.

Figure 5D:
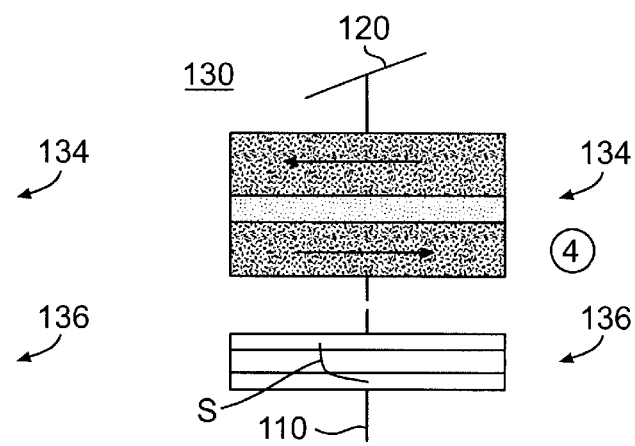
FIG. 5D is a schematic view of the first embodiment of the memory cell in a fourth state.

The fourth state for the memory cell 130 is illustrated in FIG. 5D, which can be assigned a state value of "4." In state 4, the MRAM re-writeable element 134 is in a high resistance, anti-parallel state. The MTJ write-once element 136 is in a low resistance state. The resultant resistance of the memory cell 130 is R4. In the embodiment illustrated in FIG. 5D, the low resistance state of the write-once element 136 is a short state.

The resistance values R1, R2, R3 and R4 for the memory cell 130 are detectable during a read operation, and indicate which of the states 1–4 the memory cell 130 occupies. The states 1–4 may be programmed in the memory cell 130 by a write process. In general, the memory cell 130 can occupy either of states 1 and 2 prior to programming, or writing to, the write-once element 136. After programming the write-once element 136, the memory cell 130 can occupy either of states 3 and 4.

Figure 7A:
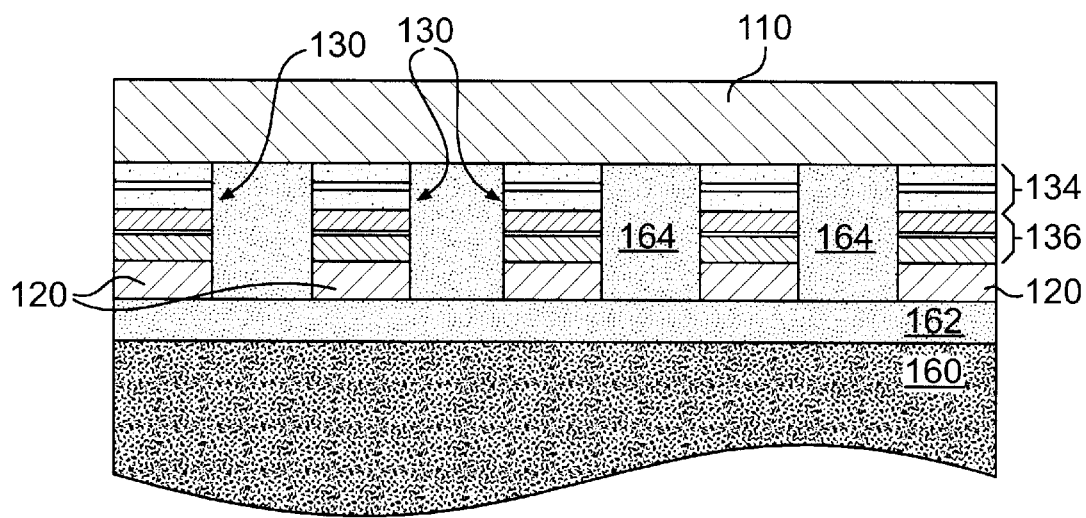
FIG. 7A is a cross sectional view of a portion of the memory array illustrated in FIGS. 3 and 4.
Figure 7B:
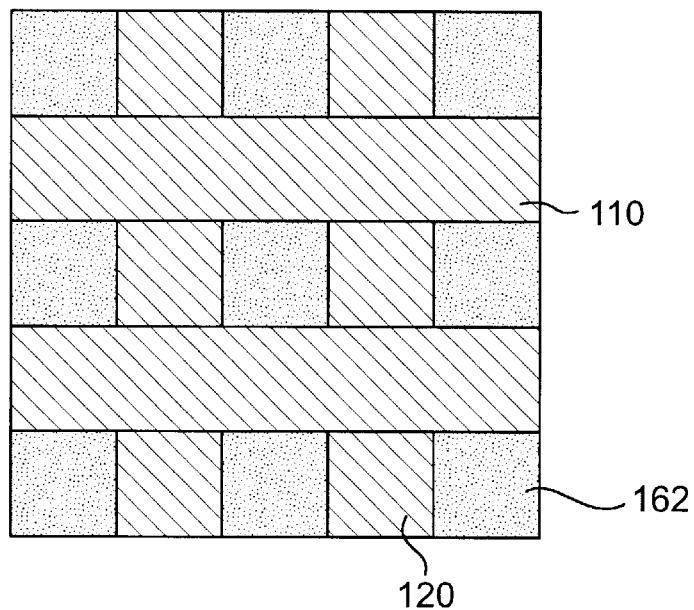
FIG. 7B is a top plan view of the portion of the memory array illustrated in FIG. 7A.

FIG. 7A is a cross sectional view of a portion of the memory array 100 including memory cells 130. FIG. 7B is a top plan view of a portion of the memory array 100. In FIG. 7B, the re-writeable elements 134 are MRAM elements, and the write-once elements 136 are MTJ elements. The memory cells 130 are disposed over a substrate 160, and are sandwiched between word lines 110 and bit lines 120. The bit lines 120 can be disposed over an insulator layer 162, which is disposed over the substrate 160 of the memory array 100. The insulator layer 162 can be, for example $SiO_x$, $SiN_x$, $SiO_xN_y$, $AlO_x$, $TaO_x$, $TiO_x$, $AlN_x$, and other non-conductive materials. The insulator layer 162 can be formed by, for example, a deposition process. The substrate 160 can be, for example, a semiconductor substrate. The substrate 160 may contain electronic circuitry, and the insulator layer 162 isolates the circuitry from the memory cells 130. Alternatively, the bit lines 120 can be disposed directly over the substrate 160. An insulator 164 may be disposed over the insulator layer 162 and between the memory cells 130. The insulator 164 is not shown in FIG. 7B for the purposes of illustration. The insulator 164 can be, for example, $SiO_x$, $SiN_x$, $SiO_xN_y$, $AlO_x$, $TaO_x$, $TiO_x$, $AlN_x$, other non-conductive materials. The insulator 164 can be formed by, for example, a deposition process.

FIGS. 8A–8D illustrate a memory cell 130 in detail, and illustrate the four states that the memory cell 130 can occupy.

Figure 8A:
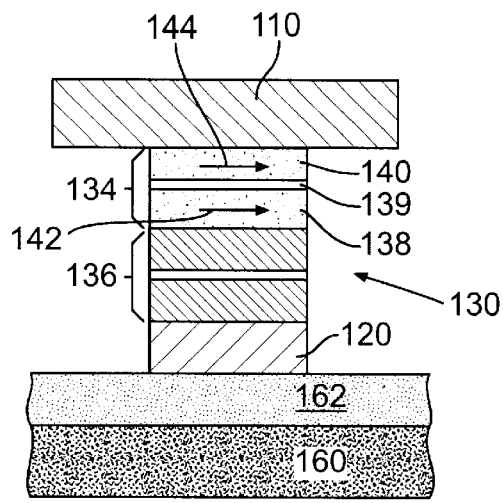
FIGS. 8A–8D illustrate the first embodiment of the memory cell in detail and the four states that the memory cell can occupy.
Figure 8B:
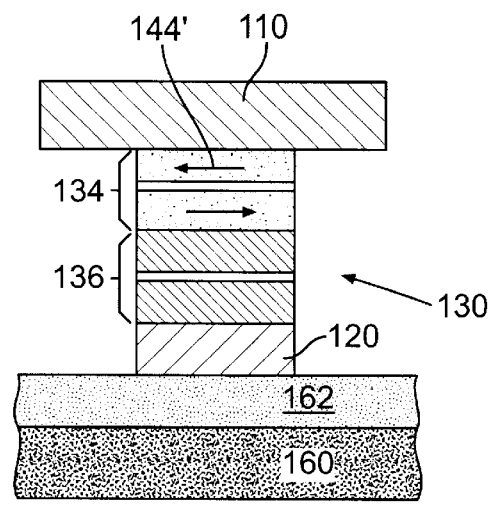

Referring to FIGS. 8A and 8B, the re-writeable element 134 comprises a pinned layer 138 and a free layer 140. The free layer 140 and the pinned layer 138 are separated by a tunnel barrier layer 139. The pinned layer 138 has a magnetization of fixed orientation, illustrated by the arrow 142. The two possible magnetization orientations of the free layer 140 are illustrated by the arrows 144 (FIG. 8A) and 144' (FIG. 8B). The magnetizations are oriented in either of two anti-parallel directions along an "easy axis" of the free layer 140. The free layer 140 can be a made from ferromagnetic materials such as, for example, NiFe and NiFeCo. The pinned layer 138 can be formed as multiple layers by any known processes for forming pinned layers in MRAM devices. For example, the layer 138 can comprise a seed layer of NiFe or NiFeCo, an anti-ferromagnetic metallic layer, and a layer of NiFe or NiFeCo disposed over the anti-ferromagnetic layer. The tunnel barrier layer 139 can be a made from materials such as $SiO_x$, $SiN_x$, $SiO_xN_y$, $AlO_x$, $TaO_x$, $TiO_x$, $AlN_x$, and other insulators.

The memory cell 130 in FIG. 8A is in parallel orientation, which corresponds to state 1 illustrated in FIG. 6. The memory cell 130 in FIG. 8B has anti-parallel orientation, which corresponds to state 2.

The memory cell 130 in state 1 has not been programmed. As in conventional MRAM devices, in order to switch a selected memory cell 130 from state 1 to state 2, a write current Ix is supplied to a word line 110 and a write current Iy is supplied to a bit line 120 crossing at the selected memory cell 130. The combined magnetic field generated by the two write currents Ix and Iy switch the magnetization of the free layer 140 from parallel to anti-parallel with the pinned layer 138. The write current Iy can be applied in the opposite direction (i.e., a current–Iy) to switch the memory cell from state 2 back to state 1.

The write current Ix can be applied at a selected memory cell 130 by closing a switch in the row decoder 300 to couple a row containing the selected memory cell 130 to the write current Ix. At the same time, the selected row is coupled to ground by closing a switch in the switch bank 302. The write current Iy can be applied at a selected memory cell 130 by closing a switch in the column decoder 400 to couple a column containing the selected memory cell 130 to the write current Iy. At the same time, the selected column is coupled to ground by closing a switch in the switch bank 402.

Programming the write-once element 136 allows the memory cell 130 to be switched between states 3 and 4, and has the effect of shifting the total resistance of the memory cell 130 downward. The re-writeable element 134 can have, for example, a low resistance value of R−ΔR/2 while in state 1 (see FIG. 6). The high resistance of the re-writeable element 134 in state 2 can be R+ΔR/2. The resistance of the write-once element 136 can be, for example, R, in states 1 and 2. In this case, the resistance of a memory cell 130 in state 1 is 2R−ΔR/2, and the resistance of a memory cell 130 in state 2 is 2R+ΔR/2. The structure of the write-once element 136 is discussed below.

Figure 8C:
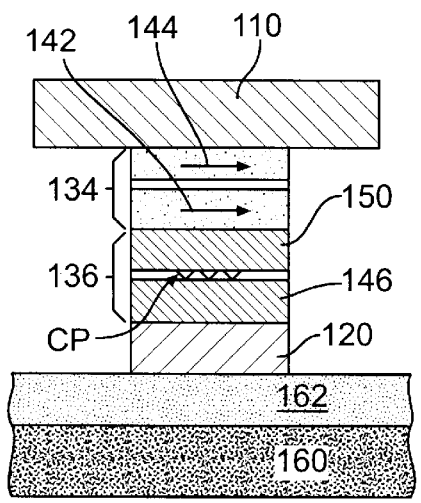
Figure 8D:
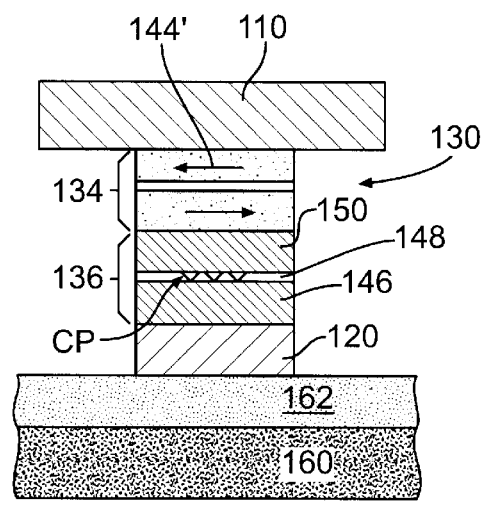

In the embodiment illustrated in FIGS. 8A–8D, the write-once element 136 is an MTJ. Referring to FIGS. 8C and 8D, the write-once element 136 comprises a first conductor 146, a tunnel barrier 148, and a second conductor 150. The first and second conductors 146, 150 can be made from any conductive material, such as, for example, aluminum, copper, silver, gold, alloys thereof, and other conductors, and can be formed by, for example, a deposition process. The tunnel barrier 148 can be made from materials such as, for example, $SiO_x$, $SiN_x$, $SiO_xN_y$, $AlO_x$, $TaO_x$, $TiO_x$, $AlN_x$, and other dielectric materials, and can be formed by deposition processes.

Prior to programming, the write-once element 136 can have a resistance of, for example, R. The write-once element 136 can be shorted during programming by applying the write voltage Vw to the memory cell 130. After shorting the write-once element, the resistance values for states 3 and 4 may be approximated by R−Δ/2 and R+ΔR/2, respectively. The downward shift in resistance of the memory cell 130 is illustrated in FIG. 6.

The write-once element 136 is shorted by applying a driving source potential (i.e., the write voltage Vw) to the memory cell 130. The write voltage Vw causes conductive materials of one of the conductors 146, 150 to diffuse through the barrier layer 148 to the other conductor. As illustrated in FIGS. 8C and 8D, conductive paths CP are formed from the second conductor 150 to the first conductor 146 when the write voltage Vw is applied. Shorting the write-once element 136 changes the resistance of the write-once element 136 from a high value of R to a low resistance value. The low resistance value can be, for example, an order to magnitude or more lower than the resistance of the write-once element 136 prior to programming.

The write voltage Vw can be applied to a selected memory cell 130 by closing a switch in the row decoder 300 to couple a row containing the selected memory cell 130 to the write voltage Vw. At the same time, the selected memory cell 130 may be coupled to ground by closing a switch in the column decoder 400. The write-once element 136 can also be programmed by applying a write current Iw to the selected memory cell 130. The distinction between using a write voltage Vw and a write current Iw is merely a function of the write circuitry (e.g. a voltage source versus a current source) used to program an array, and the two methods produce similar results.

Once the write-once element 136 is programmed, the re-writeable element 134 can be switched between parallel and anti-parallel to place the memory cell in states 3 and 4, respectively. The memory cell 130 in FIG. 8C is in state 3, and the memory cell 130 in FIG. 8D is in state 4. If the write-once element 136 is shorted, the resistance of the memory cell 130 can be approximated by the resistance of the re-writeable element 134. Therefore, the resistance of the memory cell 130 in state 3 can be approximated by R−ΔR/2, and the resistance of the memory cell 130 in state 4 is R+ΔR/2. The resistance states 1–4 of the memory cell 130 are detectable during a read operation.

Figure 9A:
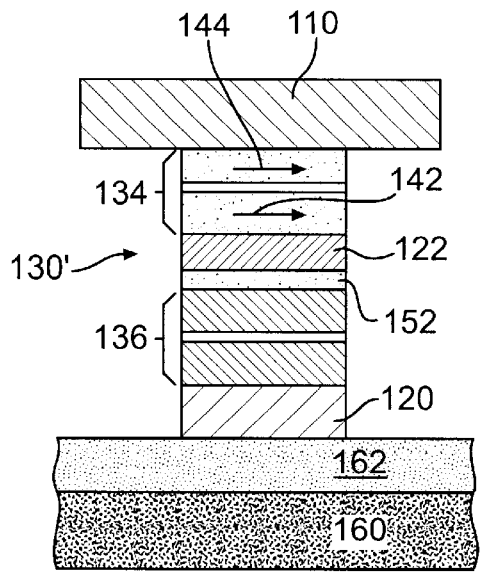
FIG. 9A is a cross sectional view of a portion of a memory array including memory cells according to an alternative embodiment.
Figure 9B:
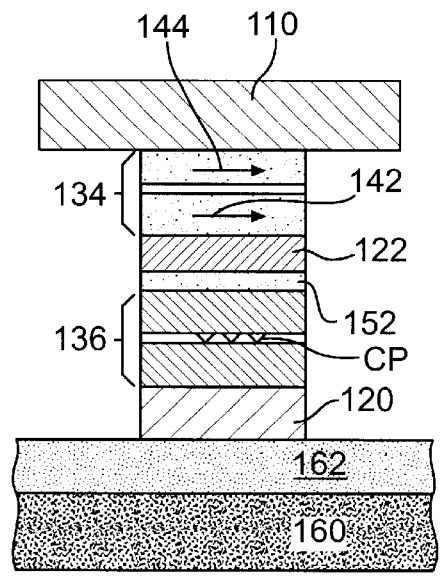
FIG. 9B is a sectional view of a portion of the memory array illustrated in FIG. 9A.
Figure 9C:
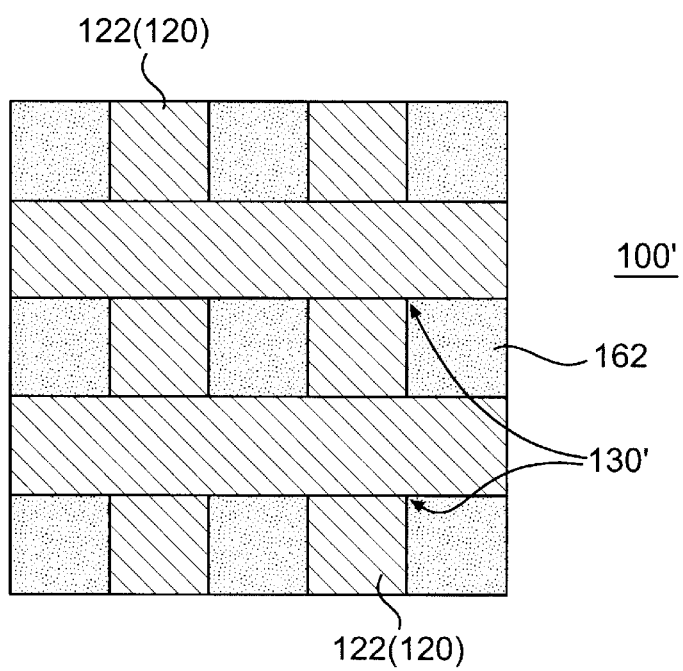
FIG. 9C is a top plan view of a portion of the memory array illustrated in FIGS. 9A and 9B.

FIGS. 9A–9C illustrate an alternative embodiment of a memory array 100' having memory cells 130'. FIGS. 9A and 9B are side elevational cross sectional views of a portion of the memory array 100' including a memory cell 130'. FIG. 9C is a top plan view of a portion of the memory array 100' having memory cells 130'. As in the embodiments illustrated in FIGS. 8A–8D, the memory cell 130' includes a write-once element 136 in series with a re-writeable element 134. The re-writeable element 134 can be an MRAM element, and the write-once element 136 can be an anti-fuse element such as a tunnel junction (TJ). The memory cell 130' can occupy a state 1 and a state 2 depending upon the orientation of the magnetization of the re-writeable element 134, and can occupy states 3 and 4 after the write-once element 136 is programmed and conductive paths CP are formed in the write-once element 136.

The memory array 100' can be similar to the memory array 100 illustrated in FIG. 3, and can be utilized in the memory device 10 illustrated in FIG. 4. However, in the embodiment illustrated in FIGS. 9A–9C, the memory array 100' includes additional columns of intermediate conductors 122 extending parallel to and spaced from the bit lines 120. The parallel arrangement of the intermediate conductors 122 and the bit lines 120 is illustrated in FIG. 9C. If the intermediate conductors 122 extend along columns of the memory array 100', the column decoder 400 (see FIG. 4) and the switch bank 402 can be provided with an additional set of switches to couple the selected columns of intermediate conductors 122 to Iy, Vw, Iw, or to ground.

The intermediate conductors 122 serve as an intermediate electrode in the memory cells 130'. In this embodiment, a write voltage Vw or a write current Iw can be applied to the write-once element 136 without exposing the re-writeable element 134 to the write current Iw or the write voltage Vw. Specifically, in order to program the write-once element 136 in a selected memory cell 130', the write voltage Vw or the write current Iw could be applied to the bit line 120 and the intermediate conductor 122 could be coupled to ground. The word line 110 could be uncoupled from ground, thereby preventing current flow through the re-writeable element 134 during programming of the write-once element 136.

Similarly, a write current +/− Iy can be passed through the intermediate conductor 122 and the write current Ix can be passed through the word line 110 to change the orientation of magnetization of the re-writeable element 134, thereby switching a selected memory cell 130' between states 1 and 2, or between states 3 and 4.

The memory cell 130' may also include a resistive element 152 in series with the re-writeable element 134 and the write-once element 136. The resistive element 152 shifts the resistances of the states 1–4 upward in FIG. 6, but does not change the general operation of the memory cell embodiment. The resistive element 152 can be made from materials such as, for example, a layer of diamond-like carbon (DLC), a layer of Ti/Ta/X, where X is a metal, a layer of Ti/TaN/TiW, and other materials. The material and/or thickness of the resistive element 152 are selected so that the resistive element 152 does not behave as an anti-fuse during programming of the memory cell 130'.

In the embodiment illustrated in FIGS. 9A–9C, intermediate conductors could alternatively extend parallel and spaced from the word lines 110, rather than the bit lines 120. In this configuration, the re-writeable elements 134, rather than the write-once elements 136, are located between the intermediate conductors and the bit lines 120, so that orthogonal currents can be applied to program the re-writeable elements 134. If intermediate conductors extend along rows of the memory arrray 100', the row decoder 300 and the switch bank 302 can be provided with an additional set of switches to couple the selected columns of intermediate conductors to Iy, Vw, Iw, Vr, or to ground.

The above embodiments are discussed in terms of shorting the write-one element. The resistance of a memory cell may also be changed by partially diffusing conductive elements across the first tunnel junction dielectric. This is referred to as a "partial blow." A partial blow of a tunnel junction reduces the resistance of the tunnel junction without completely shorting the tunnel junction.

Figure 10A:
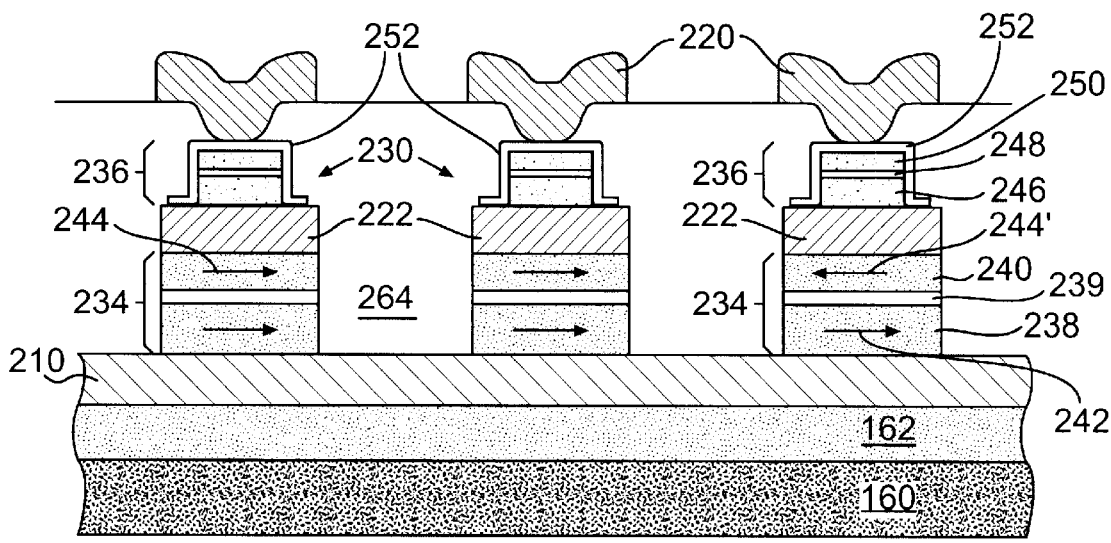
FIG. 10A is a side elevational cross sectional view of a portion of a memory array having memory cells according to another alternative embodiment.
Figure 10B:
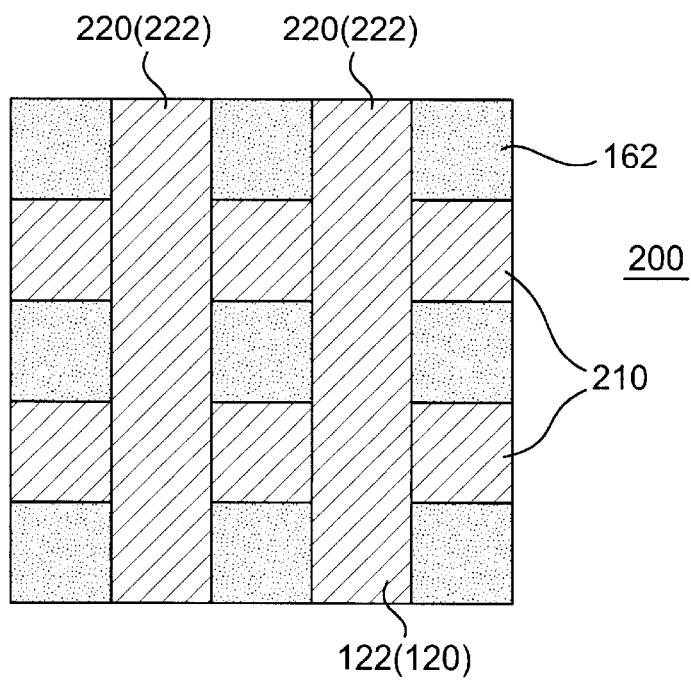
FIG. 10B is a top plan view of the portion of the array illustrated in FIG. 10A.

FIG. 10A is a side elevational cross sectional view of a portion of an array 200 having alternative memory cells 230. FIG. 10B is a top plan view of the portion of the array 200 shown in FIG. 10A. The array 200 shown in FIGS. 10A and 10B can be similar in configuration to the array 100 shown in FIGS. 3 and 4, and can be incorporated in the memory device 10 illustrated in FIG. 4.

The memory cells 230 include a re-writeable element 234 in series with a write-once element 236. The memory cells 230 are sandwiched between word lines 210 and bit lines 220, and insulation 264 can be disposed between the memory cells 230. The insulation 264 is not illustrated in FIG. 10B for illustrative purposes.

In the embodiment illustrated in FIGS. 10A and 10B, the write-once element 236 is a fuse element. The memory cells 230 are similar to the memory cells 130 discussed above in that the combination of a write-once element with a re-writeable element provides for four states in the memory cells 230. However, when a fuse write-once element 236 in a selected memory cell 230 is programmed, the resistance of the selected memory cell 230 increases, rather than decreases.

The re-writeable element 234 can be an element such as, for example, an MRAM element. The MRAM element 234 comprises a pinned layer 238 and a free layer 240. The free layer 240 and the pinned layer 238 are separated by a tunnel barrier layer 239. The magnetization orientations of the free layer 240 are illustrated by the arrows 244 and 244', and the magnetization orientation of the pinned layer 238 is illustrated by array 242.

The fuse write-once element 236 comprises a fuse layer 248 sandwiched between terminals 246, 250. The fuse layer 248 can be, for example, a thin film resistor, and may be formed from semiconductor materials such as, for example, Si, Ge, or conductors such as Al, Cu, Ag, Au, Pt, and alloys thereof. Low melting point materials, such as, for example, In, Zn, Sn, Pb, refractory metals (e.g. Ta, W), and transition metals such as Ni, Cr and alloys thereof may also be used. The terminals 246, 250 can be made from any conductive material, such as, for example, Al, Cu, Ag, Au, Pt, and other conductors, and can be formed by deposition processes. The write-once element 236 can also include a parallel, or "shunt" resistance 252. The shunt resistance 252 prevents an open circuit across the memory cell 230 when the write-once element 236 is programmed. The shunt resistance 252 can be made from resistive material such as materials used in semiconductor processing. Examples or such materials include nitrides, silicides, doped oxides, and other semiconductor materials.

Figure 11:
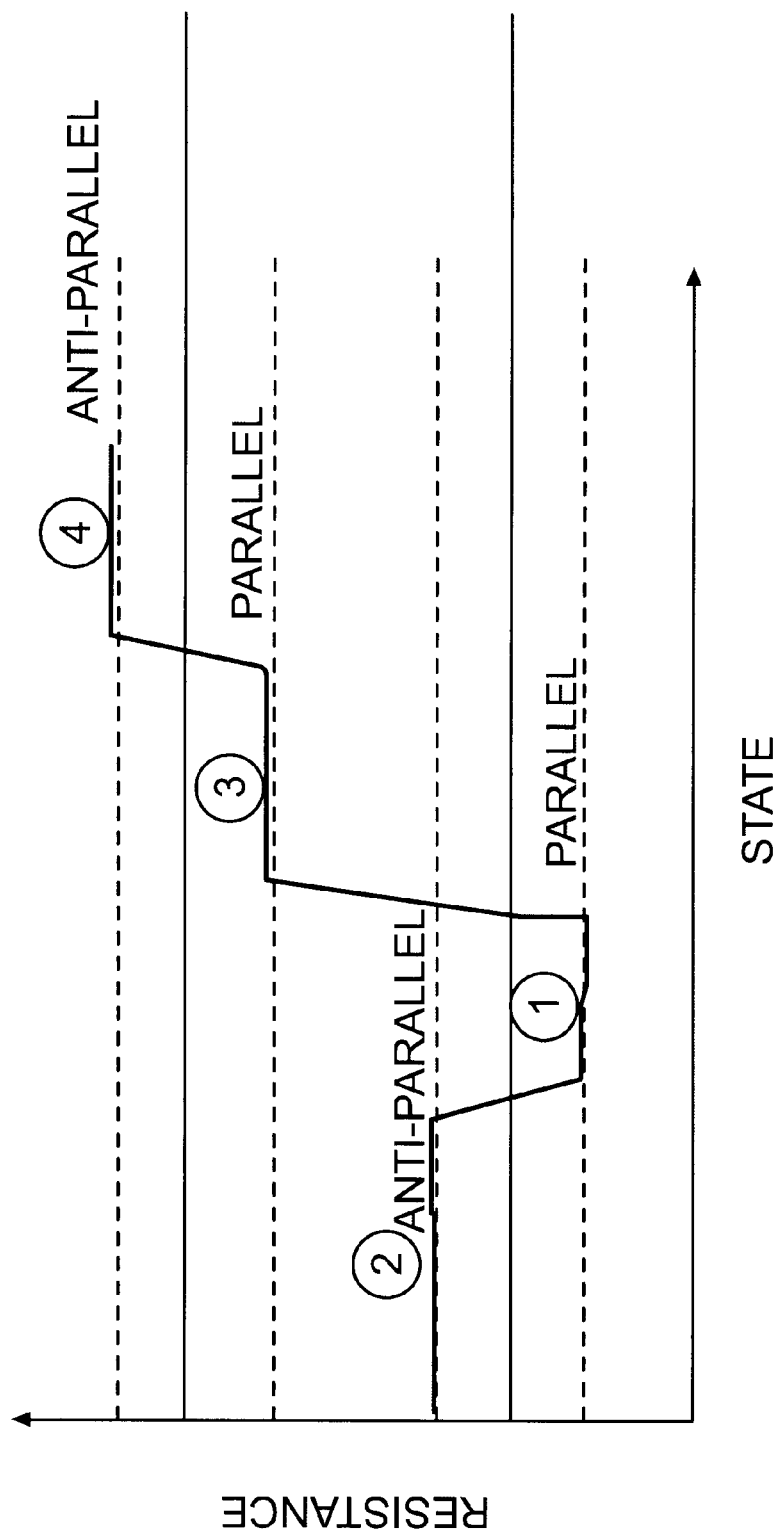
FIG. 11 illustrates resistance values of the memory cells illustrated in FIG. 10A.

The memory cells 230 can occupy any one of states 1–4. The resistance states of the memory cell 230 are illustrated in FIG. 11. Before programming the write-once element 236, the memory cell can occupy either of states 1 and 2. Programming the write-once element 236 allows the memory cell 230 to be switched between states 3 and 4. The re-writeable element 234 can have, for example, a low resistance value in state 1 (parallel) and a high resistance of the re-writeable element 234 in state 2 (anti-parallel).

In the embodiment illustrated in FIGS. 10A and 10B, the write-once element 236 is a fuse element. Prior to programming, the write-once element 236 can have a relatively low resistance. The write-once element 236 can be blown during programming by a supplying a write voltage Vw voltage or a write current Iw to the memory cell 230. Applying the write voltage Vw or write current Iw breaks down the. fuse layer 248, opening the circuit between the terminals 246, 250. The resistance of the write-once element 236 increases to a high state, and may be approximately equal to the resistance of the shunt resistance 252 if the fuse layer 248 is completely blown. The resistance of the write-once element may also be increased by a "partial blow" of the fuse layer 248, where some conductive portions of the fuse layer 248 remain intact.

Blowing the fuse layer 248 increases the total resistance of the memory cell 230. The upward shift in resistance is shown in FIG. 11. After programming the write-once element 236, the memory cell 230 can be switched between states 3 and 4.

The array 200 illustrated in FIGS. 10A and 10B includes intermediate conductors 222. The intermediate conductors 222 extend parallel to and spaced from the bit lines 220. The intermediate conductors 222 serve as intermediate electrodes in the memory cells 230. A write voltage Vw or a write current Iw can therefore be applied to the write-once element 236 without exposing the re-writeable element 234 to the current Iw or the voltage Vw. The write-once element 236 can be programmed by applying a write voltage Vw or the write current Iw to the bit line 220 and the intermediate conductor 222 can be coupled to ground. The word line 210 can be uncoupled from ground to prevent current flow through the re-writeable element 234. Similarly, a write current +/− Iy can be passed through the intermediate conductor 222 and a write current Ix can be passed through the word line 210 to change the orientation of magnetization of the re-writeable element 234.

In the embodiment illustrated in FIGS. 10A and 10B, intermediate conductors could alternatively extend parallel and spaced from the word lines 210, rather than parallel to the bit lines 220. In this configuration, the re-writeable elements 234, rather than the write-once elements 236, are located between the intermediate conductors and the bit lines 220 so that orthogonal currents can be applied to program the re-writeable elements 234.

If the intermediate conductors 222 extend along columns of the memory array 100', the column decoder 400 (see FIG. 4) and the switch bank 402 can be provided with an additional set of switches to couple the selected columns of intermediate conductors 222 to Iy, Vw, Iw, or to ground. If intermediate conductors extend along rows of the memory array 200', the row decoder 300 and the switch bank 302 can be provided with an additional set of switches to couple the selected columns of intermediate conductors to Iy, Vw, Iw, Vr, or to ground.

A method of making the memory array 200 will now be discussed with reference to FIGS. 12A-12C.

Figure 12A:
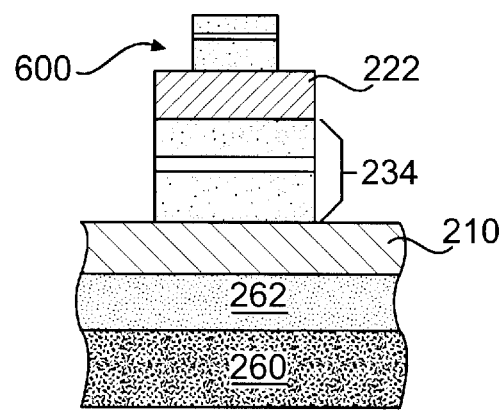
FIGS. 12A–12C illustrate a method of making the array illustrated in FIGS. 10A and 10B.

Referring to FIG. 12A, which illustrates a single memory cell 230 in the memory array 200 being fabricated, the memory array 200 can be formed by depositing an insulator layer 262 over a substrate 260. The insulator layer can be, for example $SiO_x$, $SiN_x$, $SiO_xN_y$, $AlO_x$, $TaO_x$, $TiO_x$, $AlN_x$, and other non-conductive materials. The insulator layer 262 can be formed by, for example, a deposition process. The substrate 160 can be, for example, a semiconductor substrate. Word lines 210 are formed over the insulator layer 262.

The re-writeable elements 234 are then formed over the word lines 210. If the re-writeable elements 234 are MRAM elements, the elements 234 can be formed by any known methods for fabricating MRAM storage elements.

Intermediate conductors 222 are then formed over the re-writeable elements 234. The intermediate conductors 222 can be formed by, for example, a deposition process.

Write-once elements 600 are next formed over the re-writeable elements 234. The write-once elements 600 can be formed by successive deposition processes.

Figure 12B:
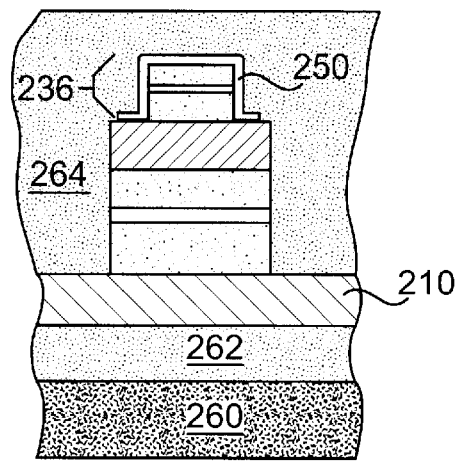

Referring to FIG. 12B, resistive material 250 is deposited over the write-once elements 600, completing the write-once elements 236. The array being fabricated is then covered by an insulator 264. The insulator 264 can be, for example $SiO_x$, $SiN_x$, $SiO_xN_y$, $AlO_x$, $TaO_x$, $TiO_x$, $AlN_x$, and other non-conductive materials. The insulator layer 264 can be formed by, for example, a deposition process.

Figure 12C:
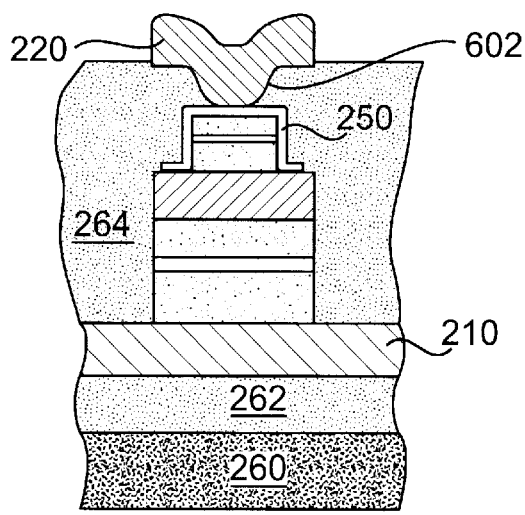

Referring to FIG. 12C, vias 602 are opened in the insulator 264 over the write-once elements 236. The vias 602 can be created by, for example, etching. Conductive bit lines 220 are then formed over the vias 602.

Figure 13:
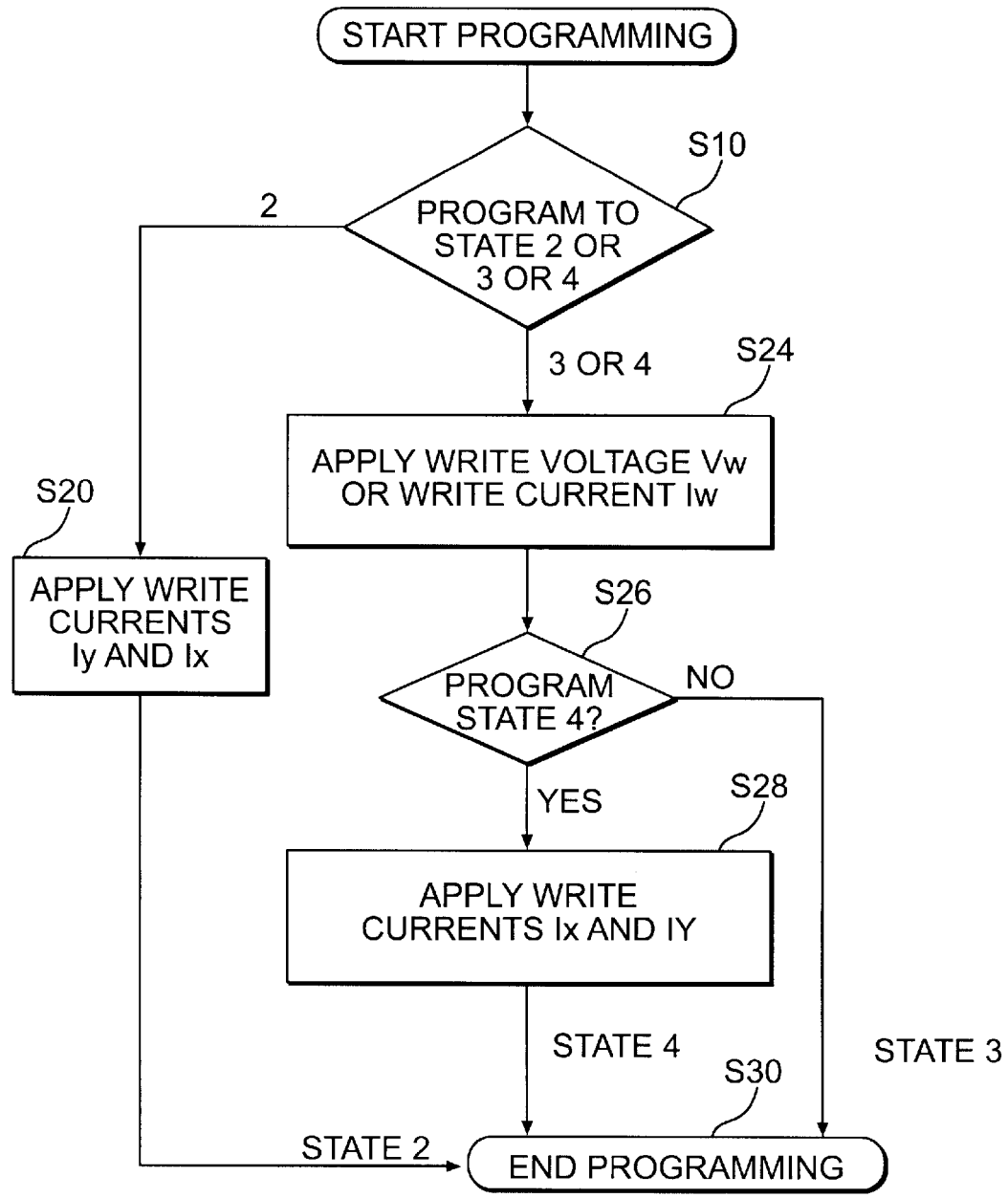
FIG. 13 is a flow chart illustrating a write operation.

A write operation used to program the memory cells embodiments described above will now be discussed with reference to FIG. 13. The steps described in the write operation can be used to program an array comprising any of the embodiments of the memory cells 130, 130' or 230. In the write operation illustrated in FIG. 13, the selected memory cell is initially in state 1.

In step S10, a controller or other processing device (not illustrated) determines whether the selected memory cell is to be programmed to state 2, or to state 3 or 4. If the selected memory cell is to be programmed to state 2, write currents Ix and Iy are applied at the selected memory cell. The write currents Ix and Iy can be orthogonal currents that generate a combined magnetic field to switch the magnetization orientation of an MRAM re-writeable element in the selected memory cell. If the memory array 100 includes intermediate conductors, either of the write currents Ix or Iy can generated in the intermediate conductor passing through the selected memory cell. The selected memory cell is now in state 2, and the programming of the cell is ended in step S30.

If the selected memory cell is to be programmed to states 3 or 4, the write-once element in the selected cell is first programmed. In step S24, a write voltage Vw or a write current Iw is applied to the selected memory cell to program the selected memory cell. If the memory array 100 includes intermediate conductors, the write voltage Vw or a write current Iw can be applied to the intermediate conductor passing through the selected memory cell, so that only the write-once element is exposed to the write voltage Vw or write current Iw. Alternatively, the intermediate conductor could be connected to ground and the write current Iw or write voltage Vw could be applied at the word line intersecting the selected memory cell.

If the selected memory cell includes an anti-fuse write-once element, the anti-fuse element is blown, and may be shorted to reduce the resistance of the selected memory cell. If the selected memory cell includes a fuse write-once element, the fuse element is blown, increasing the resistance of the selected memory cell. The selected memory cell is now in state 3. If state 3 is the desired state for the selected memory cell, the programming of the cell is ended in step S30.

If the selected memory cell is to be programmed to state 4, write currents Ix and Iy are applied at the selected memory cell in step S28, as described in state S20 above. Programming of the cell is ended in step S30.

The above method describes programming of a selected memory cell initially at state 1. The memory cell embodiments discussed above can be switched between states 1 and 2 before programming the write-once elements. For example, a memory cell in state 2 can be switched to state 1 by applying write currents Ix and –Iy at the selected memory cell. Similarly, a selected memory cell can be switched between states 3 and 4 after programming of the write-once element in the memory cell.

A read process for the memory device 10 will now be discussed with reference to FIG. 4. The memory device 10 can advantageously employ an equipotential read process, as disclosed in U.S. Pat. No. 6,259,644 to Tran et al., the contents of which are hereby incorporated by reference. An equipotential read process is outlined below with reference to a selected memory cell 130, however the process described is appropriate for a memory device 10 employing the alternative memory cell embodiments described in this specification.

In order to determine a state of (i.e., to read) a selected memory cell 130, a read potential Vr is applied to the word line 110 corresponding to the row of the selected memory cell 130, and the bit line 120 corresponding to the column of the selected memory cell 130 is coupled to the sense amplifier 500 through the column decoder 400. The sense amplifier 500 can be at, for example, virtual ground. An equal potential can be applied to all other bit lines 120 in the memory array 100. The sense amplifier 500 senses the current from the selected bit line 120 to determine the binary state of the selected memory cell 130. The state may be detected by a processing device (not shown) coupled to an output from the sense amplifier 500, the output of the sense amplifier 500 indicating the resistance of the selected memory cell 130. Alternatively, the sense amplifier 500 can include circuitry to determine the state of the selected memory cell 130, and to output the state to a processing device.

A selected memory cell 130 can occupy any one of states 1–4, each state corresponding to a different resistance value of the cell 130. As shown in FIG. 6, which discloses resistance values in the anti-fuse embodiment, the states can be 2, 1, 4, 3 in order of decreasing magnitude. Therefore, read currents sensed by the sense amplifier 500 for each of states 3, 4, 1, and 2 will be $I_3$, $I_4$, $I_1$, $I_2$, respectively, in order to decreasing magnitude. As shown in FIG. 11, which discloses resistance values in the fuse embodiment, the states can be 4, 3, 2, 1 in order of decreasing magnitude. Therefore, read currents sensed by the sense amplifier 500 for each of states 1, 2, 3, and 4 will be $I_1$, $I_2$, $I_3$, $I_4$, respectively, in order to decreasing magnitude.

If a memory device 10 includes intermediate conductors, such as in the memory array cells illustrated in FIGS. 9A–10B, the intermediate conductors can be used in read schemes. For example, a voltage may be applied to the intermediate conductors 122 as illustrated in FIGS. 9A–9C in order to balance the equipotential scheme.

Another alternative read method includes using the intermediate conductors to read the write-once elements and the re-writeable elements separately.

According to the above embodiments, the memory device 10 does not require active silicon-based isolation elements such as diodes or transistors in order to isolate the memory cells in the memory array. The memory device 10 can therefore include stacked memory elements, increasing array density. MRAM, fuse and anti-fuse devices can be made relatively small, which further increases the possible array density for the array 100.

According to the above embodiments, states of 1–4 can be stored in the memory cells. This convention, however, is arbitrary, and any symbolic values can be used to indicate the states of the memory cells discussed above.

In the present specification, the terms "row" and "column" or "word" and "bit" do not imply a fixed orientation in a memory array. In addition, these terms do not necessarily imply an orthogonal relationship.

The sense amplifier 500 illustrated in FIG. 4 is an example of a sensing device for detecting a binary state of a the memory cells in the memory device 10. In practice, other sensing devices, such as a trans-impedance sense amplifier, a charge-injection sense amplifier, a differential sense amplifier, or a digital differential sense amplifier, for example, can be used. One sense amplifier 500 is illustrated in FIG. 4. In practice, a greater number of sensing devices can be coupled to a memory array. For example, a sense amplifier can be included for each bit line in a memory array.

The memory device embodiments discussed above can be used in a wide variety of applications. One application may be a computing device having a storage module. The storage module may include one or more memory arrays for long term storage. The storage module can be used in devices such as laptop computers, personal computers, and servers.

While the memory device 10 is described with reference to exemplary embodiments, many modifications will be readily apparent to those skilled in the art, and the present disclosure is intended to cover variations thereof.

What is claimed is:

1. A memory array, comprising:
    a plurality of memory cells;
    a plurality word lines coupled to the memory cells; and
    a plurality of bit lines coupled to the memory cells, wherein the word lines cross the bit lines at the memory cells, and wherein a memory cell comprises:
        a write-once element; and
        a re-writeable element in series with the write-once element.

2. The memory array of claim 1, wherein the memory cell is programmable between a first and a second state before the write-once element is programmed.

3. The memory array of claim 2, wherein the memory cell is programmable between a third and a fourth state after the write-once element is programmed.

4. The memory array of claim 3, wherein the write-once element comprises an anti-fuse element.

5. The memory array of claim 4, wherein the re-writeable element comprises a magnetic random access memory element.

6. The memory array of claim 3, wherein the write-once element comprises a fuse element.

7. The memory array of claim 6, wherein the re-writeable element comprises a magnetic random access memory element.

8. The memory array of claim 1, wherein the re-writeable element is programmable between a high resistance state and a low resistance state.

9. The memory array of claim 8, wherein the write-once element is programmable from a high resistance state to a low resistance state.

10. The memory array of claim 8, wherein the write-once element is programmable from a low resistance state to a high resistance state.

11. The memory array of claim 1, wherein the memory cell can occupy any of four states, each state corresponding to one of four resistances of the memory cell.

12. The memory array of claim 1, comprising:
    a plurality of intermediate conductors extending across the array and intersecting the memory cells.

13. The memory array of claim 12, wherein the intermediate conductors extend between the write-once elements and the re-writeable elements of the memory cells.

14. The memory array of claim 1, wherein the write-once element comprises:
    two conductors; and
    a tunnel barrier disposed between the conductors.

15. The memory array of claim 14, wherein the re-writeable element comprises:
    a pinned layer;
    a free layer; and
    a tunnel barrier disposed between the free layer and the pinned layer.

16. A method of programming a selected memory cell in a memory array, the memory array comprising an array of memory cells, a plurality of word lines coupled to the memory cells, and a plurality of bit lines coupled to the memory cells, a memory cell comprising a first programmable write-once element and a second programmable re-writeable element in series with the first element, the method comprising:
    programming the selected memory cell to one of four states, each state corresponding to a different resistance of the selected memory cell, wherein the step of programming comprises:
        applying at least one of a write voltage and a write current to the write-once element; and
        applying write currents to the word and bit line crossing at the selected memory cell.

17. The method of claim 16, wherein the step of applying at least one of a write voltage and a write current comprises:
    switching the memory cell between a first and a second state before programming the second element.

18. The method of claim 17, wherein the step of applying write currents comprises:
    switching the memory cell between a third and a fourth state after programming the second element.

* * * * *